United States Patent
Ye et al.

(10) Patent No.: US 9,494,658 B2
(45) Date of Patent: Nov. 15, 2016

(54) APPROACH FOR GENERATION OF POWER FAILURE WARNING SIGNAL TO MAXIMIZE USEABLE HOLD-UP TIME WITH AC/DC RECTIFIERS

(71) Applicant: Flextronics AP, LLC, Broomfield, CO (US)

(72) Inventors: Zhen Z. Ye, Garland, TX (US); Xiangping Xu, Garland, TX (US)

(73) Assignee: Flextronics AP, LLC, Broomfield, CO (US)

( * ) Notice: Subject to any disclaimer, the term of this patent is extended or adjusted under 35 U.S.C. 154(b) by 695 days.

(21) Appl. No.: 13/829,793

(22) Filed: Mar. 14, 2013

(65) Prior Publication Data

US 2014/0266293 A1   Sep. 18, 2014

(51) Int. Cl.
*G01R 31/40* (2014.01)
*G01R 19/165* (2006.01)
*G06F 1/30* (2006.01)

(52) U.S. Cl.
CPC ......... *G01R 31/40* (2013.01); *G01R 19/16538* (2013.01); *G06F 1/30* (2013.01)

(58) Field of Classification Search
CPC ............... G01R 31/40; G01R 19/16538; G06F 1/30
USPC ............................................ 324/764.01, 771
See application file for complete search history.

(56) References Cited

U.S. PATENT DOCUMENTS

| | | | | |
|---|---|---|---|---|
| 4,077,061 A | * | 2/1978 | Johnston | G01R 21/133 324/142 |
| 4,122,359 A | * | 10/1978 | Breikss | G11O 5/141 307/64 |
| 4,234,920 A | * | 11/1980 | Van Ness | G01R 19/16538 327/143 |

(Continued)

FOREIGN PATENT DOCUMENTS

| | | |
|---|---|---|
| JP | 4217869 A | 8/1992 |
| JP | 10243640 A | 9/1998 |

(Continued)

OTHER PUBLICATIONS

EE Times.com—"Team Claims Midrange Wireless Energy Transfer", by R. Colin Johnson, 4 pages, Nov. 6, 2007.

(Continued)

*Primary Examiner* — Arleen M Vazquez
*Assistant Examiner* — Sean Curtis
(74) *Attorney, Agent, or Firm* — Haverstock & Owens LLP (57) ABSTRACT

A method of optimally generating a power failure warning (PFW) signal has been disclosed here in such a manner that adjusts timing of PFW signal generation according to load conditions in case of input AC voltage loss. A PFW voltage threshold value can be set at a lower value under light load conditions and at a higher value under heavy load conditions. PFW signal generation can also be triggered by a timing mechanism that is set when a bus voltage drops to a voltage threshold value. A countdown time of the timing mechanism is set according to a determined bus voltage drop rate. In this manner, issuance of the PFW signal is delayed for lighter load conditions and the power supply unit is capable of extending normal operation under lighter load conditions before the PFW signal is issued.

14 Claims, 5 Drawing Sheets

(56) References Cited

U.S. PATENT DOCUMENTS

| | | | |
|---|---|---|---|
| 4,245,289 A * | 1/1981 | Mineck | H02M 3/3378 |
| | | | 327/31 |
| 4,273,406 A | 6/1981 | Okagami | |
| 4,327,298 A * | 4/1982 | Burgin | H02J 9/06 |
| | | | 307/66 |
| 4,370,703 A | 1/1983 | Risberg | |
| 4,381,457 A * | 4/1983 | Wiles | G06F 1/30 |
| | | | 307/64 |
| 4,489,394 A * | 12/1984 | Borg | G06F 1/24 |
| | | | 713/1 |
| 4,535,410 A * | 8/1985 | O'Mara | H02H 3/243 |
| | | | 340/663 |
| 4,563,731 A | 1/1986 | Sato et al. | |
| 4,611,289 A * | 9/1986 | Coppola | G06F 1/30 |
| | | | 713/300 |
| 4,642,616 A | 2/1987 | Goodwin | G01R 19/145 |
| | | | 307/413 |
| 4,645,278 A | 2/1987 | Yevak et al. | |
| 4,658,204 A * | 4/1987 | Goodwin | H02M 3/156 |
| | | | 323/285 |
| 4,703,191 A * | 10/1987 | Ferguson | G06F 1/28 |
| | | | 307/64 |
| 4,712,160 A | 12/1987 | Sato et al. | |
| 4,742,424 A * | 5/1988 | Kautzer | H02H 3/24 |
| | | | 307/129 |
| 4,750,040 A * | 6/1988 | Hakamada | G06F 1/30 |
| | | | 348/725 |
| 4,788,626 A | 11/1988 | Neidig et al. | |
| 4,806,110 A | 2/1989 | Lindeman | |
| 4,841,220 A | 6/1989 | Tabisz et al. | |
| 4,857,822 A | 8/1989 | Tabisz et al. | |
| 4,866,367 A | 9/1989 | Ridley et al. | |
| 4,884,242 A * | 11/1989 | Lacy | G11C 11/4074 |
| | | | 365/229 |
| 4,890,217 A | 12/1989 | Conway | |
| 4,893,227 A | 1/1990 | Gallios et al. | |
| 4,899,256 A | 2/1990 | Sway | |
| 4,901,069 A | 2/1990 | Veneruso | |
| 4,985,804 A * | 1/1991 | Campbell | G05F 1/569 |
| | | | 165/80.3 |
| 5,065,302 A | 11/1991 | Kanazawa | |
| 5,090,919 A | 2/1992 | Tsuji | |
| 5,101,322 A | 3/1992 | Ghaem et al. | |
| 5,105,182 A * | 4/1992 | Shindo | H02H 3/247 |
| | | | 340/654 |
| 5,126,931 A | 6/1992 | Jitaru | |
| 5,132,890 A | 7/1992 | Blandino | |
| 5,235,491 A | 8/1993 | Weiss | |
| 5,283,792 A * | 2/1994 | Davies, Jr. | G06F 1/30 |
| | | | 714/22 |
| 5,325,283 A | 6/1994 | Farrington | |
| 5,365,403 A | 11/1994 | Vinciarelli et al. | |
| 5,373,432 A | 12/1994 | Vollin | |
| 5,434,768 A | 7/1995 | Jitaru et al. | |
| 5,437,040 A * | 7/1995 | Campbell | G06F 1/28 |
| | | | 307/22 |
| 5,442,540 A | 8/1995 | Hua | |
| 5,673,185 A | 9/1997 | Albach et al. | |
| 5,712,772 A | 1/1998 | Telefus et al. | |
| 5,717,936 A * | 2/1998 | Uskali | G06F 1/30 |
| | | | 307/66 |
| 5,724,026 A * | 3/1998 | Allen | H02H 3/42 |
| | | | 307/32 |
| 5,768,118 A | 6/1998 | Faulk et al. | |
| 5,786,992 A | 7/1998 | Vinciarelli et al. | |
| 5,790,395 A | 8/1998 | Hagen | |
| 5,811,895 A | 9/1998 | Suzuki et al. | |
| 5,838,171 A * | 11/1998 | Davis | G01R 19/16538 |
| | | | 327/19 |
| 5,838,554 A | 11/1998 | Lanni | |
| 5,859,771 A | 1/1999 | Kniegl | |
| 5,903,452 A | 5/1999 | Yang | |
| 5,905,369 A | 5/1999 | Ishii et al. | |
| 5,923,543 A | 7/1999 | Choi | |
| 5,949,672 A | 9/1999 | Bertnet | |
| 5,974,551 A * | 10/1999 | Lee | G06F 1/26 |
| | | | 713/300 |
| 5,978,238 A | 11/1999 | Liu | |
| 6,009,008 A | 12/1999 | Pelly | |
| 6,091,611 A | 7/2000 | Lanni | |
| 6,183,302 B1 | 2/2001 | Daikuhara et al. | |
| 6,191,957 B1 | 2/2001 | Peterson | |
| 6,272,015 B1 | 8/2001 | Mangtani | |
| 6,275,397 B1 | 8/2001 | McClain | |
| 6,301,133 B1 * | 10/2001 | Cuadra | H02J 1/102 |
| | | | 363/65 |
| 6,307,761 B1 | 10/2001 | Nakagawa | |
| 6,323,627 B1 | 11/2001 | Schmiederer et al. | |
| 6,331,794 B1 | 12/2001 | Blanchard | |
| 6,333,650 B1 * | 12/2001 | Amin | G06F 1/26 |
| | | | 327/143 |
| 6,356,465 B2 | 3/2002 | Yasumura | |
| 6,366,476 B1 | 4/2002 | Yasumura | |
| 6,385,059 B1 | 5/2002 | Telefus et al. | |
| 6,388,897 B1 | 5/2002 | Ying et al. | |
| 6,390,854 B2 | 5/2002 | Yamamoto et al. | |
| 6,396,716 B1 | 5/2002 | Liu et al. | |
| 6,452,816 B2 | 9/2002 | Kuranki | |
| 6,459,175 B1 | 10/2002 | Potega | |
| 6,480,809 B1 * | 11/2002 | Slaight | G05B 23/0235 |
| | | | 702/118 |
| 6,487,098 B2 | 11/2002 | Malik et al. | |
| 6,535,996 B1 * | 3/2003 | Brewer | G06F 11/1441 |
| | | | 714/14 |
| 6,549,409 B1 | 4/2003 | Saxelby et al. | |
| 6,578,253 B1 | 6/2003 | Herbert | |
| 6,721,192 B1 | 4/2004 | Yang et al. | |
| 6,768,222 B1 * | 7/2004 | Ricks | G06F 1/26 |
| | | | 307/125 |
| 6,775,162 B2 | 8/2004 | Mihai et al. | |
| 6,894,461 B1 | 5/2005 | Hack et al. | |
| 6,919,715 B2 | 7/2005 | Muratov et al. | |
| 6,989,997 B2 | 1/2006 | Xu | |
| 7,035,126 B1 | 4/2006 | Lanni | |
| 7,038,406 B2 | 5/2006 | Wilson | |
| 7,061,195 B2 | 6/2006 | Ho et al. | |
| 7,102,251 B2 | 9/2006 | West | |
| 7,139,180 B1 | 11/2006 | Herbert | |
| 7,202,640 B2 | 4/2007 | Morita | |
| 7,205,752 B2 | 4/2007 | Jansen | |
| 7,208,833 B2 | 4/2007 | Nobori et al. | |
| 7,212,420 B2 | 5/2007 | Liao | |
| 7,215,560 B2 | 5/2007 | Soldano | |
| 7,239,532 B1 | 7/2007 | Hsu et al. | |
| 7,274,175 B2 | 9/2007 | Manolescu | |
| 7,315,460 B2 | 1/2008 | Kyono | |
| 7,386,286 B2 | 6/2008 | Petrovic et al. | |
| 7,395,452 B2 * | 7/2008 | Nicholson | G06F 1/30 |
| | | | 711/E12.04 |
| 7,443,700 B2 | 10/2008 | Yan | |
| 7,450,388 B2 | 11/2008 | Beihoff et al. | |
| 7,459,893 B2 | 12/2008 | Jacobs | |
| 7,554,310 B2 | 6/2009 | Chapuis et al. | |
| 7,564,706 B1 | 7/2009 | Herbert | |
| 7,570,037 B2 | 8/2009 | Li | |
| 7,579,919 B1 | 8/2009 | Cao | |
| 7,596,007 B2 | 9/2009 | Phadke | |
| 7,605,570 B2 | 10/2009 | Liu et al. | |
| 7,630,221 B2 | 12/2009 | Sui et al. | |
| 7,679,347 B2 * | 3/2010 | He | H02M 3/1584 |
| | | | 323/282 |
| 7,701,305 B2 | 4/2010 | Lin et al. | |
| 7,730,676 B2 | 6/2010 | Hon | |
| 7,755,914 B2 | 7/2010 | Telefus et al. | |
| 7,760,519 B2 | 7/2010 | Telefus et al. | |
| 7,830,684 B2 | 11/2010 | Taylor | |
| 7,924,578 B2 | 4/2011 | Jansen et al. | |
| 7,956,592 B2 | 6/2011 | Morrini et al. | |
| 7,978,489 B1 | 7/2011 | Telefus et al. | |
| 7,990,122 B2 | 8/2011 | Sase et al. | |

(56) References Cited

U.S. PATENT DOCUMENTS

| | | | |
|---|---|---|---|
| 8,018,743 B2 * | 9/2011 | Wang | H02M 3/33507 323/284 |
| 8,040,117 B2 | 10/2011 | Telefus | |
| 8,049,481 B2 | 11/2011 | Li et al. | |
| 8,059,429 B2 | 11/2011 | Huynh | |
| 8,059,434 B2 | 11/2011 | Huang et al. | |
| 8,077,489 B2 | 12/2011 | Pellen | |
| 8,094,473 B2 | 1/2012 | Moon et al. | |
| 8,102,678 B2 | 1/2012 | Jungreis | |
| 8,125,181 B2 | 2/2012 | Gregg et al. | |
| 8,126,181 B2 | 2/2012 | Yamamoto et al. | |
| 8,134,848 B2 | 3/2012 | Whittam et al. | |
| 8,155,368 B2 | 4/2012 | Cheung et al. | |
| 8,193,662 B1 * | 6/2012 | Carlson | H02J 9/061 307/23 |
| 8,194,417 B2 | 6/2012 | Chang | |
| 8,199,541 B2 | 6/2012 | Yang | |
| 8,207,717 B2 | 6/2012 | Urono et al. | |
| 8,233,298 B2 * | 7/2012 | Jang | H02M 1/4208 363/67 |
| 8,243,472 B2 | 8/2012 | Chang et al. | |
| 8,279,646 B1 | 10/2012 | Hamstra | |
| 8,289,741 B2 | 10/2012 | Jungreis | |
| 8,344,689 B2 | 1/2013 | Boguslavskij | |
| 8,363,434 B2 | 1/2013 | Lin | |
| 8,369,111 B2 | 2/2013 | Balakrishnan et al. | |
| 8,385,032 B1 | 2/2013 | Mao et al. | |
| 8,400,801 B2 | 3/2013 | Shinoda | |
| 8,410,768 B2 | 4/2013 | Huber et al. | |
| 8,441,810 B2 | 5/2013 | Telefus et al. | |
| 8,488,340 B2 | 7/2013 | Zhang et al. | |
| 8,520,410 B2 | 8/2013 | Telefus et al. | |
| 8,654,553 B1 * | 2/2014 | Ye | H02M 1/4208 323/207 |
| 8,749,210 B1 | 6/2014 | Nakao et al. | |
| 8,767,357 B2 | 7/2014 | Xie et al. | |
| 8,780,597 B2 | 7/2014 | Xu | |
| 9,007,087 B2 * | 4/2015 | Avritch | G01R 31/028 324/764.01 |
| 9,049,028 B2 * | 6/2015 | Tajima | H04L 12/10 |
| 2001/0036091 A1 | 11/2001 | Yasumura | |
| 2002/0008963 A1 | 1/2002 | Dibene et al. | |
| 2002/0011823 A1 | 1/2002 | Lee | |
| 2002/0036200 A1 | 3/2002 | Ulrich et al. | |
| 2003/0035303 A1 | 2/2003 | Balakrishnan et al. | |
| 2003/0112645 A1 | 6/2003 | Schlecht | |
| 2004/0062061 A1 | 4/2004 | Bourdillon | |
| 2004/0149551 A1 | 8/2004 | Porter | |
| 2004/0183510 A1 | 9/2004 | Sutardja et al. | |
| 2004/0252529 A1 | 12/2004 | Huber et al. | |
| 2005/0024016 A1 | 2/2005 | Breen et al. | |
| 2005/0036338 A1 | 2/2005 | Porter et al. | |
| 2005/0117376 A1 | 6/2005 | Wilson | |
| 2005/0138437 A1 | 6/2005 | Allen et al. | |
| 2005/0194942 A1 | 9/2005 | Hack et al. | |
| 2005/0225257 A1 | 10/2005 | Green | |
| 2005/0254268 A1 | 11/2005 | Reinhard et al. | |
| 2005/0270001 A1 | 12/2005 | Jitaru | |
| 2006/0002155 A1 | 1/2006 | Shteynberg et al. | |
| 2006/0022637 A1 | 2/2006 | Wang et al. | |
| 2006/0146461 A1 * | 7/2006 | Jones | G06F 1/30 361/62 |
| 2006/0152947 A1 | 7/2006 | Baker et al. | |
| 2006/0198172 A1 * | 9/2006 | Wood | H02M 1/4233 363/89 |
| 2006/0208711 A1 * | 9/2006 | Soldano | H02M 1/4225 323/225 |
| 2006/0213890 A1 | 9/2006 | Kooken et al. | |
| 2006/0232220 A1 | 10/2006 | Melis | |
| 2006/0291512 A1 | 12/2006 | Borschowa | |
| 2007/0040516 A1 | 2/2007 | Chen | |
| 2007/0086224 A1 | 4/2007 | Phadke et al. | |
| 2007/0087784 A1 | 4/2007 | Yamamoto et al. | |
| 2007/0120542 A1 | 5/2007 | LeMay | |
| 2007/0121981 A1 | 5/2007 | Koh et al. | |
| 2007/0138971 A1 | 6/2007 | Chen | |
| 2007/0242487 A1 | 10/2007 | Orr | |
| 2007/0247091 A1 | 10/2007 | Maiocchi | |
| 2007/0263415 A1 | 11/2007 | Jansen et al. | |
| 2007/0279955 A1 * | 12/2007 | Liu | H02M 1/4208 363/125 |
| 2007/0298653 A1 | 12/2007 | Mahoney et al. | |
| 2008/0002444 A1 * | 1/2008 | Shekhawat | H02M 1/34 363/127 |
| 2008/0018265 A1 | 1/2008 | Lee et al. | |
| 2008/0043496 A1 | 2/2008 | Yang | |
| 2008/0130322 A1 * | 6/2008 | Artusi | H02M 1/4225 363/21.01 |
| 2008/0191667 A1 | 8/2008 | Kernahan et al. | |
| 2009/0034299 A1 | 2/2009 | Lev | |
| 2009/0045889 A1 | 2/2009 | Goergen et al. | |
| 2009/0089604 A1 * | 4/2009 | Malik | G06F 1/28 713/340 |
| 2009/0168472 A1 * | 7/2009 | Chung | H02M 3/1584 363/65 |
| 2009/0196073 A1 | 8/2009 | Nakahori | |
| 2009/0207637 A1 | 8/2009 | Boeke | |
| 2009/0230929 A1 | 9/2009 | Sui et al. | |
| 2009/0290384 A1 | 11/2009 | Jungreis | |
| 2009/0300400 A1 | 12/2009 | DuBose | |
| 2010/0039833 A1 | 2/2010 | Coulson et al. | |
| 2010/0103711 A1 * | 4/2010 | Komatsuzaki | H02J 9/062 363/132 |
| 2010/0110732 A1 | 5/2010 | Moyer | |
| 2010/0254057 A1 * | 10/2010 | Chen | H02H 3/04 361/91.2 |
| 2010/0277837 A1 | 11/2010 | Myhre | |
| 2010/0289466 A1 | 11/2010 | Telefus et al. | |
| 2010/0317216 A1 | 12/2010 | Pocrass | |
| 2010/0322441 A1 | 12/2010 | Weiss et al. | |
| 2010/0332857 A1 * | 12/2010 | Vogman | G06F 1/263 713/300 |
| 2011/0037444 A1 * | 2/2011 | Wildash | H02M 1/44 323/210 |
| 2011/0112700 A1 * | 5/2011 | Tajima | G06F 1/26 700/293 |
| 2011/0132899 A1 | 6/2011 | Shimomugi et al. | |
| 2011/0211376 A1 | 9/2011 | Hosotani | |
| 2011/0213999 A1 * | 9/2011 | Lecourtier | G06F 1/263 713/324 |
| 2011/0215647 A1 * | 9/2011 | Lecourtier | H02J 9/061 307/66 |
| 2011/0222318 A1 * | 9/2011 | Uno | H02M 1/4225 363/21.05 |
| 2011/0261590 A1 | 10/2011 | Liu | |
| 2012/0069609 A1 | 3/2012 | Christophe et al. | |
| 2012/0112657 A1 | 5/2012 | Van Der Veen et al. | |
| 2012/0113686 A1 | 5/2012 | Telefus et al. | |
| 2012/0144183 A1 * | 6/2012 | Heinrichs | G06F 11/3062 713/100 |
| 2012/0153917 A1 * | 6/2012 | Adell | H02M 3/1588 323/283 |
| 2012/0268084 A1 | 10/2012 | Wang et al. | |
| 2013/0003427 A1 * | 1/2013 | Pan | H02M 1/4225 363/44 |
| 2013/0016545 A1 * | 1/2013 | Xu | H02M 1/44 363/126 |
| 2013/0027011 A1 | 1/2013 | Shih et al. | |
| 2013/0049709 A1 | 2/2013 | Fu et al. | |
| 2013/0148385 A1 | 6/2013 | Zhang | |
| 2013/0155728 A1 * | 6/2013 | Melanson | H02M 1/44 363/21.16 |
| 2013/0329469 A1 * | 12/2013 | Kubota | H02M 3/33507 363/21.16 |
| 2014/0008979 A1 * | 1/2014 | Kinnard | G06F 1/263 307/29 |
| 2014/0153299 A1 | 6/2014 | Jeong et al. | |

(56) References Cited

U.S. PATENT DOCUMENTS

2014/0268912 A1 9/2014 Telefus
2015/0002108 A1 1/2015 Kim
2015/0052390 A1* 2/2015 Dryer .................. G06F 1/30
　　　　　　　　　　　　　　　　　　714/14

FOREIGN PATENT DOCUMENTS

| JP | 11202027 A * | 7/1999 |
|---|---|---|
| JP | 2000083374 A | 3/2000 |
| JP | 20000253648 A | 9/2000 |
| JP | 2004208357 A | 7/2004 |

OTHER PUBLICATIONS

EE Times. com—"Wireless Beacon Could Recharge Consumer Devices", by R. Colin Johnson, 3 pages, Nov. 6, 2007.
Novel Zero-Voltage and Zero-Current Switching (ZVZCS) Full Bridge PWM converter Using Coupled Output Inductor, Sep. 2002 IEEE, pp. 641-648.
"New Architectures for Radio-Frequency dc/dc Power Conversion", Juan Rivas et al., Laboratory for Electromagnetic and Electronic Systems, Jan. 2004, Massachusetts Institute of Technology, Room 10-171 Cambridge, MA 02139, pp. 4074-4084.
"Randomized Modulation in Power Electronic Converters". Aleksander M. Stankovic, member IEEE, and Hanoch Lev-Ari, vol. 90, No. 5, May 2002, pp. 782-799.
"Analysis and Special Characteristics of a Spread-Spectrum Technique for Conducted EMI Suppression", K.K. tse, et al. Member IEEE, IEEE Transactions on Power Electronics, vol. 15., No. 2, Mar. 2000, pp. 399-410.
"Practical on-Line Identification of Power Converter Dynamic Respones", Botao Miao et al., Colorado Power Electronics Center, ECE Department, 2005, pp. 57-62.
"A Modified Cross-Correlation Method for System Identification of Power Converters with Digital Control", Botao Miao et al., Colorado Power Electronics Center, ECE Department, 2004, pp. 3728-3733.
"Design and Implementation of an Adaptive Tuning System Based on Desired Phase Margin for Digitally Controlled DC-DC Converters", Jeffrey Morroni et al., Member IEEE, 2009, pp. 559-564.

* cited by examiner

APPROACH FOR GENERATION OF POWER FAILURE WARNING SIGNAL TO MAXIMIZE USEABLE HOLD-UP TIME WITH AC/DC RECTIFIERS

FIELD OF THE INVENTION

The present invention is generally directed to the field of power supplies. More specifically, the present invention is directed to generating a power failure warning signal by an AC-to-DC power supply.

BACKGROUND OF THE INVENTION

A power supply unit converts main AC voltage to one or more regulated DC voltages supplied to one or more loads, such as the internal components of a computer, server, or other electrical device.

Figure 1:
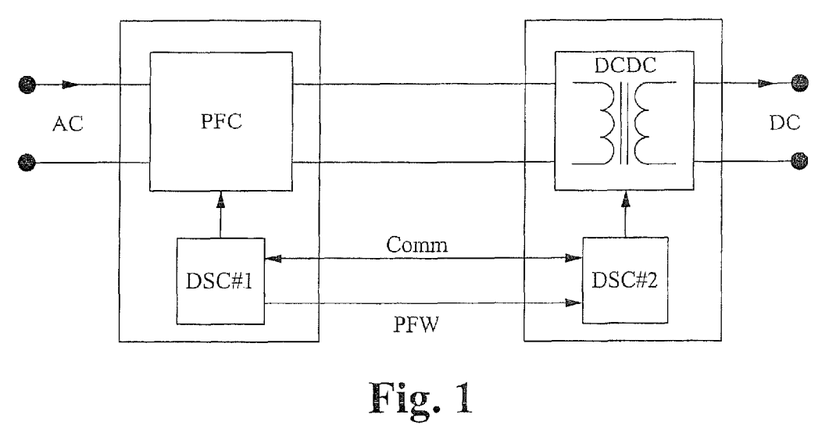
FIG. 1 illustrates a conventional power supply unit under digital control for supplying power to a server.

FIG. 1 illustrates a conventional power supply unit under digital control for supplying power to a server. The power supply unit includes a primary side for power factor correction (PFC) and AC-to-DC voltage conversion, and a secondary side for DC-to-DC voltage conversion. The primary side receives an AC input voltage, such as the main line AC voltage, and outputs a DC bus voltage, such as 400V. The secondary side converts the DC bus voltage output from the primary side to a desired DC voltage level that is used by a coupled load, such as 15V, 5V, or 3.3V. The PFC stage on the primary side is digitally controlled by a first digital signal controller (DSC). The DC-to-DC stage on the secondary side is digitally controlled by a second DSC or an analog control chip with a microcontroller (MCU) for management. There is bi-directional or unidirectional communication signals sent between the primary side and the secondary side. One such communication signal is a Power Failure Warning (PFW) signal sent from the primary side to the secondary side. The PFW signal is used for notifying the secondary side of the power supply, and even systems coupled to the secondary side, that action needs to be taken due to the near term power supply shutoff, which is typically a few milliseconds after input AC voltage loss. This warning gives the secondary side and/or system an opportunity to take proper measures such as unloading so as to avoid any damage or failure or even operating data loss due to AC voltage loss. The PFW signal is triggered when the DC bus voltage output from the PFC stage has decreased to a threshold level, typically resulting from the loss of the input AC voltage. In an exemplary implementation, the PFC stage includes a bulk capacitor coupled to store energy and also smooth the ripple on the bus voltage. It is the bulk capacitor that provides the stored energy to the secondary side for continuous operation during the intervals between input AC voltage loss and device shutoff. In normal operation, the normal bus voltage is a function of the AC voltage. However, when there is a power failure, the AC voltage is lost, and the bus voltage output from the PFC stage goes down due to the discharging of the bulk capacitor. Because the dropping voltage may impact safe operation of the secondary side, in practice the DC bus voltage level needs to be monitored. If the monitored DC bus voltage drops to a PFW voltage threshold, then the PFW signal is sent from the primary side to the secondary side. If the DC bus voltage level subsequently drops further to a shutoff voltage threshold, then the power supply unit is shutoff, thereby shutting off power supplied to a coupled load.

Figure 2:
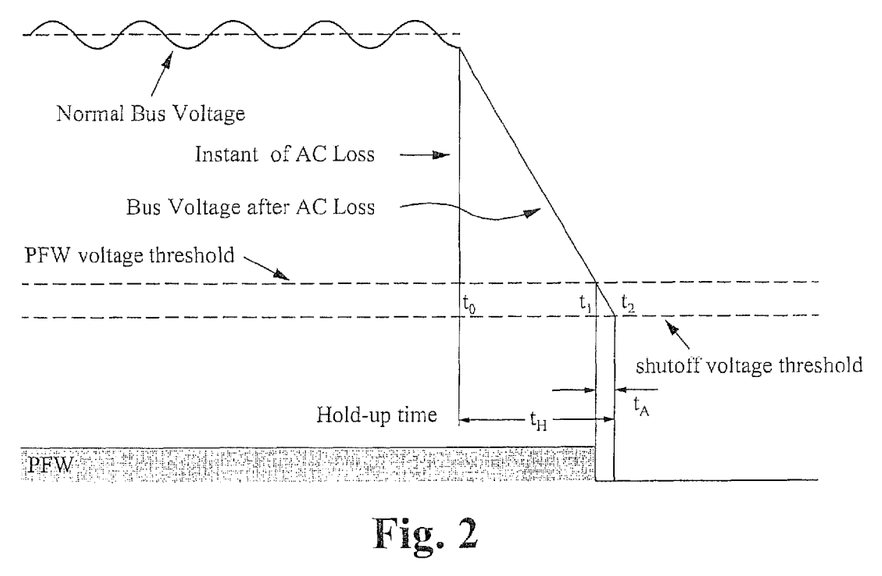
FIG. 2 illustrates an exemplary timing diagram for implementation of the PFW signal relative to the bus voltage output from the PFC stage of FIG. 1.

FIG. 2 illustrates an exemplary timing diagram for implementation of the PFW signal relative to the bus voltage output from the PFC stage of FIG. 1. As shown in FIG. 2, the normal bus voltage is mainly a DC voltage plus secondary harmonics which depend on the characteristics of the specific power supply unit. At time t0, the input AC voltage is lost, at which point the DC bus voltage is no longer a function of the input AC voltage but instead is a result of the discharging energy stored in the bulk capacitor. The rate at which the bulk capacitor discharges, and therefore the rate at which the DC bus voltage decreases upon AC voltage loss is a function of the load coupled to the output of the DC-to-DC stage. The heavier the load, the greater the rate of DC bus voltage decrease. The rate at which the bus voltage decreases is barely changed if DC load has no change before and after AC voltage loss. When the DC bus voltage value decreases to a PFW voltage threshold, at time t1, the PFW signal is sent from the primary side to the secondary side. When the DC bus voltage value decreases to a shutoff voltage threshold, at time t2, the power supply unit is powered off. The time interval to is the time between issuing the PFW signal and power shutoff. The time interval tH is the hold-up time and is the time between input AC voltage loss and power shutoff. The hold-up time tH is the time delay before device shutoff provided by the bulk capacitor.

Figure 3:
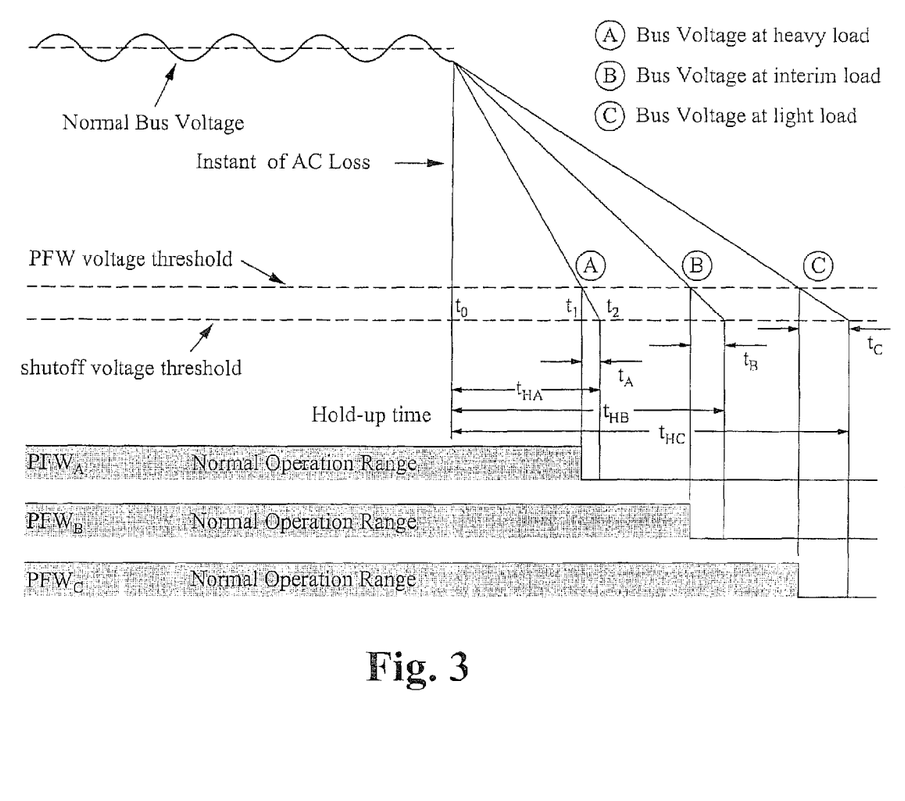
FIG. 3 illustrates exemplary timing diagrams corresponding to light load, intermediate load and heavy load conditions coupled to the power supply unit of FIG. 1.

Conventionally, the PFW voltage threshold and the shutoff voltage threshold are fixed values. Generation of the PFW signal only relies on the set value for the PFW voltage threshold regardless of load condition. FIG. 3 illustrates exemplary timing diagrams corresponding to light load, intermediate load and heavy load conditions coupled to the power supply unit of FIG. 1. The timing diagram A corresponds to a heavy load condition. The timing diagram B corresponds to intermediate load conditions. The timing diagram C corresponds to light load conditions. As previously described and shown in FIG. 3, the rate of DC bus voltage decrease is greatest for heavy load conditions and least for light load conditions. Heavy loads draw more current which leads to faster drain of the energy stored in the bulk capacitor. Accordingly, the hold-up time tHA for heavy load conditions is shorter than the hold-up time tHB for intermediate load conditions, and the hold-up time tHB for intermediate load conditions is shorter than the hold-up time tHC for light load conditions. Similarly, the interval time between issuing the PFW signal and power shutoff is shortest for heavy load conditions, interval tA, longer for intermediate load conditions, interval tB, and longest for light load conditions, interval tC.

The PFW voltage threshold and the shutoff voltage threshold are set such that the time interval between issuance of the PFW signal and power shutoff is set for worst case load conditions so as to ensure proper shutoff in the case of power loss. As heavy load conditions result in the greatest rate of DC bus voltage decrease, the PFW voltage threshold value and therefore the time interval between the issuance of the PFW signal and power shutoff is set according to the minimum time needed for shutdown, which corresponds to the heavy load condition and interval tA. For light and intermediate load conditions, the rate of DC bus voltage decrease is not as great, but the PFW voltage threshold is set according to the heavy load condition. This results in premature issuance of the PFW signal for intermediate and light load conditions, which unnecessarily constrains the run time of the power supply unit. For example, the time interval between issuance of the PFW signal and power shutoff for intermediate load conditions, interval tB, is greater than the necessary amount of time, which is interval tA. This difference between interval tB and interval tA is time that the device could be running, but is not. Similarly, the time interval tC for light load conditions is also greater than the necessary interval tA, and again results in unnecessary device down time.

SUMMARY OF THE INVENTION

Embodiments are directed to a method of optimally generating a PFW signal in such a manner that adjusts timing of PFW signal generation according to load conditions. In some embodiments, the PFW voltage threshold value is set at a lower value under light load conditions and at a higher value under heavy load conditions. In other embodiments, PFW signal generation is triggered by a timing mechanism that is set when a bus voltage drops to a voltage threshold value. A countdown time of the time mechanism is set according to a determined bus voltage drop rate. In this manner, issuance of the PFW signal is delayed for lighter load conditions and the power supply unit is capable of extending normal operation under lighter load conditions before the PFW signal is issued.

In an aspect, a method of generating a power failure warning signal is disclosed. The method includes monitoring a bus voltage of a power supply unit, adjusting a power failure warning voltage threshold value according to a varying load condition of a load coupled to an output of the power supply unit, and generating the power failure warning signal when the bus voltage drops to the power failure warning voltage threshold value. In some embodiments, adjusting the power failure warning threshold value includes determining a bus voltage drop rate and setting the power failure warning voltage threshold value according to the bus voltage drop rate to allow a minimum time period between generating the power failure warning signal and powering off the power supply unit to prepare for power shutoff. In some embodiments, adjusting the power failure warning threshold value includes determining the load condition and determining the power failure warning voltage threshold value according to the determined load condition so as to allow a minimum time period between generating the power failure warning signal and powering off the power supply unit to prepare for power shutoff.

In another aspect, another method of generating a power failure warning signal is disclosed. The method includes setting a power shutoff voltage threshold value and setting a minimum time period to prepare for power shutoff. The method also includes measuring a bus voltage within a power supply unit and determining a bus voltage drop rate. The method also includes determining when a power failure warning signal is to be generated according to the power shutoff voltage threshold value, the minimum time period to prepare for power shutoff and the bus voltage drop rate. The method also includes generating the power failure warning signal. In some embodiments, the method also includes adjusting when the power failure warning signal is to be generated according to a load condition of a load coupled to an output of the power supply unit. In some embodiments, the bus voltage drop rate is greater for heavy load conditions than for light load conditions. In some embodiments, determining when the power failure warning signal is to be generated includes setting a power failure warning voltage threshold value by calculating a voltage equal to the bus voltage drop rate multiplied by the minimum time period to prepare for power shutoff and adding the calculated voltage to the power shutoff voltage threshold value, and comparing bus voltage to the set power failure warning voltage value. In this case, the power failure warning signal is generated when the bus voltage drops to the set power failure warning voltage value. In some embodiments, determining the bus voltage drop rate includes setting a first voltage threshold value and a second voltage threshold value, wherein the first voltage threshold value is greater than the second voltage threshold value and the second voltage threshold value is greater than the power shutoff voltage threshold value, comparing the bus voltage to the first voltage threshold value and the second voltage threshold value, counting a time for the bus voltage to drop from the first voltage threshold value to the second voltage threshold value, and calculating the bus voltage drop rate by dividing a voltage difference between the first voltage threshold value and the second voltage threshold value by the counted time. In this case, determining when the power failure warning signal is to be generated and generating the power failure warning signal can include calculating a first time period for the bus voltage to drop from the second voltage threshold value to the power shutoff voltage threshold value according to the calculated bus voltage drop rate, subtracting the minimum time period to prepare for power shutoff from the first time period to equal a second time period, setting a timer to count the second time period, and generating the power failure warning signal when the second time period is counted. In some embodiments, the bus voltage drop rate varies with varying load conditions of a load coupled to an output of the power supply unit.

In yet another aspect, yet another method of generating a power failure warning signal is disclosed. The method includes setting a power shutoff voltage threshold value and setting a minimum time period to prepare for power shutoff. The method also includes receiving a load condition corresponding to a load coupled to an output of a power supply unit, determining when a power failure warning signal is to be generated according to the power shutoff voltage threshold value, the minimum time period to prepare for power shutoff and the received load condition, and generating the power failure warning signal. In some embodiments, the method can also include adjusting when the power failure warning signal is to be generated according to a varying load condition.

In still yet another aspect, a device for generating a power failure warning signal is disclosed. The device includes means for monitoring a bus voltage of a power supply unit, means for adjusting a power failure warning voltage threshold value according to a varying load condition of a load coupled to an output of the power supply unit, and means for generating the power failure warning signal when the bus voltage drops to the power failure warning voltage threshold value. In some embodiments, the means for adjusting the power failure warning threshold value includes means for determining a bus voltage drop rate and means for setting the power failure warning voltage threshold value according to the bus voltage drop rate to allow a minimum time period between generating the power failure warning signal and powering off the power supply unit to prepare for power shutoff. In some embodiments, the means for adjusting the power failure warning threshold value includes means for determining the load condition and means for determining the power failure warning voltage threshold value according to the determined load condition so as to allow a minimum time period between generating the power failure warning signal and powering off the power supply unit to prepare for power shutoff.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a method of generating a power failure warning signal. Those of ordinary skill in the art will realize that the following detailed description of the method is illustrative only and is not intended to be in any way limiting. Other embodiments of the method will readily suggest themselves to such skilled persons having the benefit of this disclosure.

Reference will now be made in detail to implementations of the method as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 4:
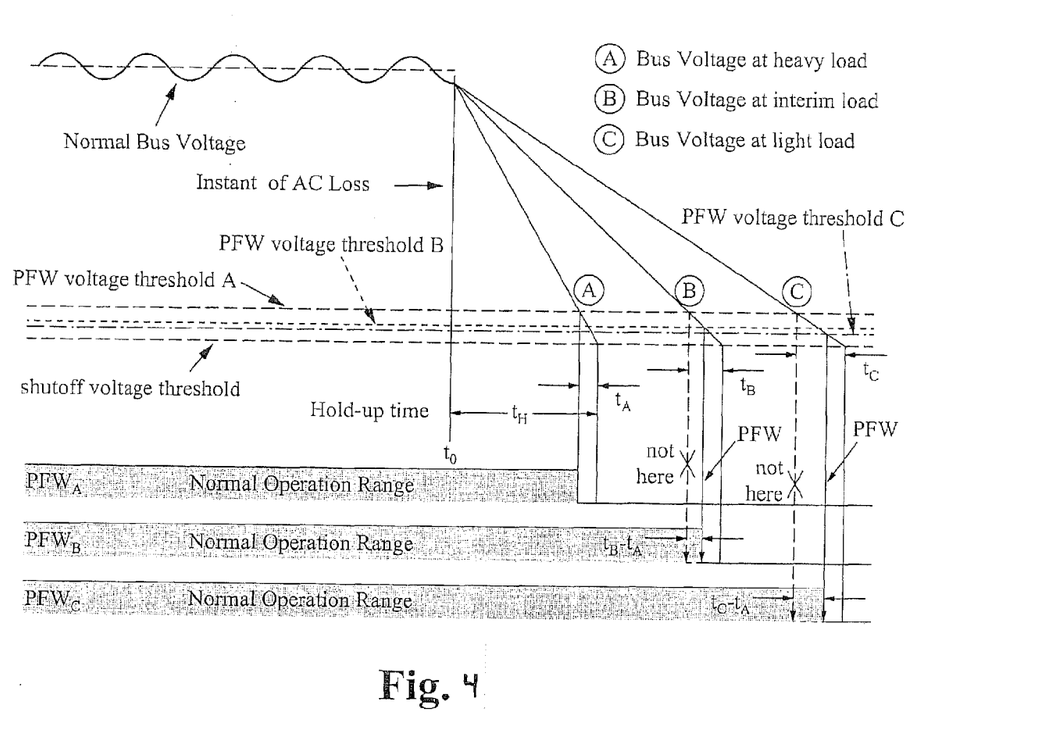
FIG. 4 illustrates a conceptual implementation of a variable PFW voltage threshold for different load conditions according to an embodiment.

FIG. 4 illustrates a conceptual implementation of a variable PFW voltage threshold for different load conditions according to an embodiment. Three exemplary timing diagrams are shown in FIG. 4, each timing diagram corresponding to a different load condition. The timing diagram A corresponds to a heavy load condition. The timing diagram B corresponds to an intermediate load condition. The timing diagram C corresponds to a light load condition. At time t0, AC input voltage is lost, and the DC bus voltage is supplied by the energy stored in the bulk capacitor. Heavy loads draw more current which leads to faster drain of the bulk capacitor. The rate of DC bus voltage decrease is greatest for heavy load conditions and least for light load conditions. Accordingly, the slope of timing diagram A, which corresponds to the heavy load condition, is greater than the slope of timing diagram B, which corresponds to the intermediate load condition, and in turn the slop of the timing diagram B is greater than the slope of the timing diagram C, which corresponds to the light load condition. The slope of each timing diagram is a function of the decreasing DC bus voltage versus time.

The power supply unit requires a set amount of time to prepare for power shutdown. This minimum time is application specific. The PFW voltage threshold value is set so as to provide the required time to prepare for power shutdown. For the heavy load condition, the PFW voltage threshold value is set at PFW voltage threshold value A. Value A is great enough that at the rate of bus voltage decrease corresponding to timing diagram A, the time to for the bus voltage to decrease from the PFW voltage threshold value A to the shutoff voltage threshold is equal to the required time to prepare for power shutdown. However, at lighter load conditions, such as the intermediate load condition corresponding to timing diagram B, the rate of bus voltage decrease is not as great and therefore the PFW voltage threshold value for the intermediate load condition does not need to be as great as the PFW voltage threshold value A corresponding to the heavy load condition. Since the rate of bus voltage decrease is lower for the intermediate load condition than for the heavy load condition, shown in FIG. 4 as the timing diagram B having a smaller slope than the timing diagram A, the PFW voltage threshold value for the intermediate load condition is set at PFW voltage threshold value B. As shown in FIG. 4, the PFW voltage threshold value B is set at a lower voltage level than the PFW voltage threshold value A. Due to the lower rate of bus voltage decrease for the intermediate load condition, the lower PFW voltage threshold value B still provides the required time, time tA, to prepare for power shutdown. For illustrative purposes, FIG. 4 shows the amount of time tB that would have been provided to prepare for power shutdown if the same PFW voltage threshold value A had also been used for the intermediate load condition. By instead using the lowered PFW voltage threshold value B for the intermediate load condition the device extends its normal operating time. The amount of extended normal operating time is equal to the difference between time tB and tA (tB–tA). In other words, the power supply unit, and the intermediate load coupled to the power supply unit, is capable of extending normal operation before the PFW signal is issued.

Similarly, the rate of bus voltage decrease continues to decrease for still lighter load conditions, such as the light load condition corresponding to timing diagram C. The rate of bus voltage decrease is not as great for the light load condition as for the intermediate load condition and therefore the PFW voltage threshold value for the light load condition does not need to be as great as the PFW voltage threshold value B corresponding to the intermediate load condition. Since the rate of bus voltage decrease is lower for the light load condition than for the intermediate load condition, shown in FIG. 4 as the timing diagram C having a smaller slope than the timing diagram B, the PFW voltage threshold value for the light load condition is set at PFW voltage threshold value C. As shown in FIG. 4, the PFW voltage threshold value C is set at a lower voltage level than the PFW voltage threshold value B. Due to the lower rate of bus voltage decrease for the light load condition, the lower PFW voltage threshold value C still provides the required time, time tA, to prepare for power shutdown. For illustrative purposes, FIG. 4 shows the amount of time tC that would have been provided to prepare for power shutdown if the same PFW voltage threshold value A had also been used for the light load condition. By instead using the lowered PFW voltage threshold value C for the light load condition the device further extends its normal operating time. The amount of extended normal operating time under the light load condition is equal to the difference between time tC and tA (tB−tA). As compared to a fixed PFW voltage threshold value, a variable PFW voltage threshold value, such as the PFW voltage threshold B for the intermediate load condition and the PFW voltage threshold value C for the light load condition, enables extended normal operating time for the power supply unit under lighter load conditions.

Figure 5:
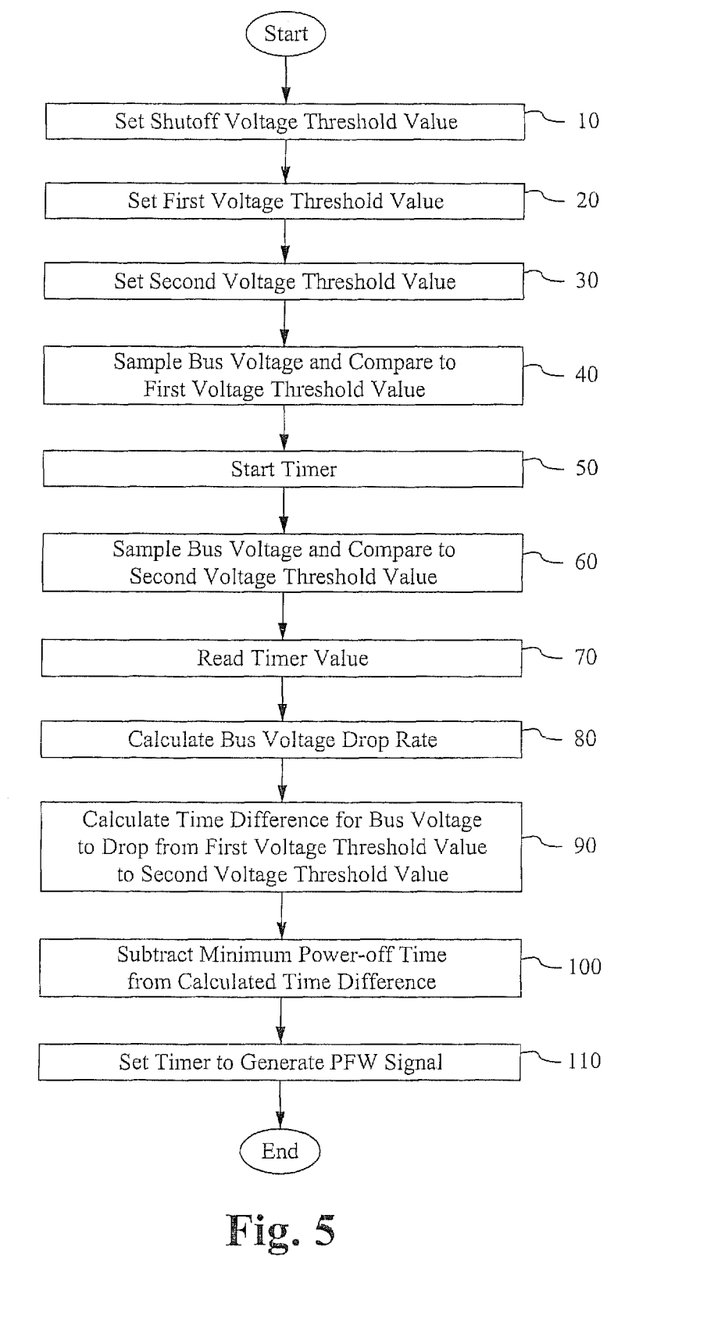
FIG. 5 illustrates an exemplary method for determining a variable PFW voltage threshold value.
Figure 6:
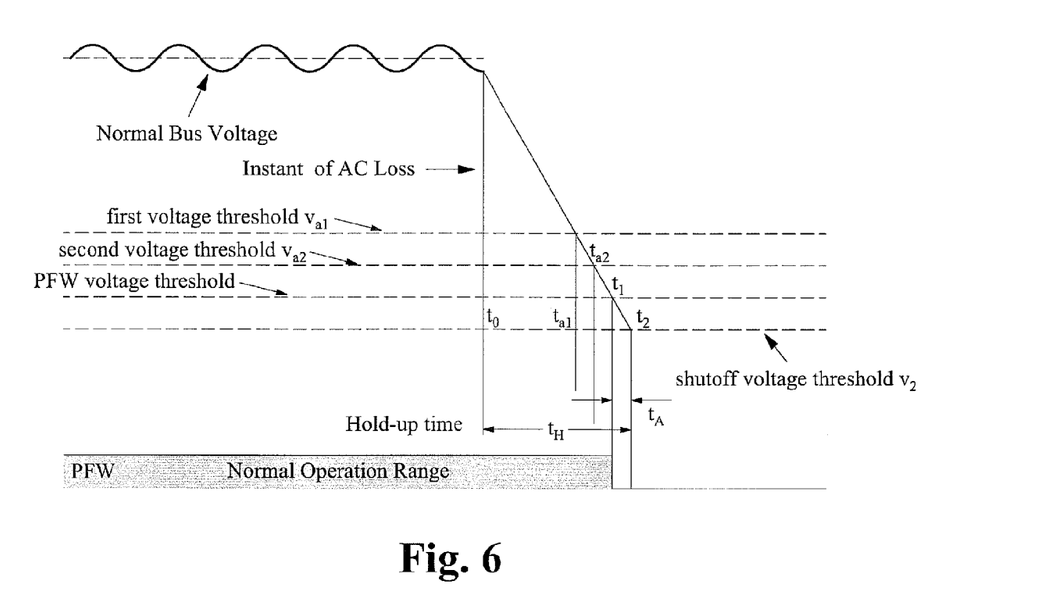
FIG. 6 illustrates a conceptual implementation of the method of FIG. 5 for a given load condition.
Figure 7:
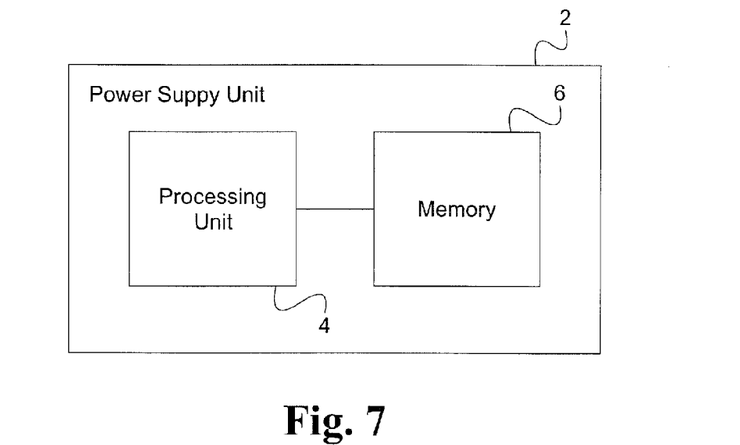
FIG. 7 illustrates a power supply unit according to some embodiments.

In some embodiments, the method of determining the variable PFW voltage threshold value utilizes a calculation algorithm implemented in firmware. In some embodiments, the method determines a rate of bus voltage decrease after AC voltage lost and using this determined rate to calculate the PFW voltage threshold value relative to a predetermined shutoff voltage threshold value. FIG. 5 illustrates an exemplary method for determining a variable PFW voltage threshold value. FIG. 6 illustrates a conceptual implementation of the method of FIG. 5 for a given load condition. The exemplary implementation shown in FIG. 6 corresponds to the heavy load condition of FIG. 4. It is understood that the method of FIG. 5 can be applied to other load conditions. The method is implemented by a processing unit included within a power supply unit or alternatively by a processing unit externally coupled to the power supply unit. In some embodiments, the processing unit is a DSC included within the power supply unit. Memory sufficient for implementing the method can be included within the processing unit, separate from the processing unit and within the power supply unit, or externally coupled to the power supply unit. FIG. 7 illustrates a power supply unit according to some embodiments. The exemplary power supply unit 2 includes a processing unit 4 and a memory 6. The processing unit 4 is configured to implement the method described herein. It is understood that alternative configurations are contemplated as described above.

At the step 10, a shutoff voltage threshold value for the power supply unit is set. When the bus voltage value reaches the shutoff voltage threshold value, the power supply unit is shutoff. As shown in FIG. 6, the set shutoff voltage threshold value corresponds to shutoff voltage threshold value V2. The shutoff voltage threshold value is a fixed, predetermined value based on design specifications of the power supply unit including the DC output voltage(s).

At the step 20, a first voltage threshold value is set. As shown in FIG. 6, the set first voltage threshold value corresponds to the first voltage threshold value Va1.

At the step 30, a second voltage threshold value is set. As shown in FIG. 6, the set second voltage threshold value corresponds to the second voltage threshold value Va2. The first voltage threshold value Va1 is greater than the second voltage threshold value Va2. The second voltage threshold value Va2 is greater than the shutoff voltage threshold value V2. Both the first voltage threshold value Va1 and the second voltage threshold value Va2 will be greater than a subsequently determined PFW voltage threshold value. In an exemplary application, the normal bus voltage when AC input voltage is present is approximately 400V, the first voltage threshold value Va1 is approximately 340V, the second voltage threshold value Va2 is approximately 330V, and the shutoff voltage threshold value V2 is approximately 316V.

At the step 40, the bus voltage is sampled and the sampled bus voltage value is compared to the first voltage threshold value Va1. If it is determined that the sampled bus voltage is greater than the first voltage threshold value Va1, then the step 40 is repeated for the next sampled bus voltage. If it is determined that the sampled bus voltage is less than or equal to the first voltage threshold value Va1, then as long as the bus voltage remains less than or equal to the first threshold voltage value Va1 the method moves to the step 50. The bus voltage is sampled according to a determined sampling rate. In some embodiments, sampling is performed by the primary side DSC in the power supply unit. In other embodiments, a sampling circuit separate from the primary side DSC is used to sample the bus voltage.

At the step 50, a timer is started from a zeroed value.

At the step 60, the bus voltage is sampled and the sampled bus voltage is compared to the second voltage threshold value Va2. If it is determined that the sampled bus voltage is greater than the second voltage threshold value Va2, then the step 60 is repeated for the next sampled bus voltage. The sampled bus voltage is also compared to the first voltage threshold value Va1 to determine if the sampled bus voltage is still less than or equal to the first threshold voltage value Va1. If the sampled bus voltage remains less than or equal to the first threshold voltage value Va1, then the timer continues running and step 60 is repeated. If it is determined that the sampled bus voltage is less than or equal to the second voltage threshold value Va2, then the method moves to the step 70.

At the step 70, the timer value is read, the value of which corresponds to the amount of time for the bus voltage to decrease from the first voltage threshold value Va1 to the second voltage threshold Va2.

At the step 80, the bus voltage drop rate is calculated. The bus voltage drop rate corresponds to the rate at which the bus voltage is decreasing. The bus voltage drop rate is calculated based on the known voltage drop between the first threshold voltage value Va1 and the second threshold voltage value Va2 and the time read out from the timer at the step 70. Specifically, if the timer value is the difference between the time ta1 at which the sampled bus voltage equals the first voltage threshold value Va1 and the time ta2 at which the sampled bus voltage equals the second voltage threshold value Va2, then the timer value is ta2−ta1 and the bus voltage drop rate is equal to (Va1−Va2)/(ta2−ta1).

At the step 90, the bus voltage drop rate calculated in step 80 and the known voltage difference between the second voltage threshold value Va2 and the shutoff voltage threshold value V2 are used to calculate the time difference, t2−ta2, between the second voltage threshold value Va2 and the shutoff voltage threshold value V2. The time difference t2−ta2 is calculated by:

$$t2-ta2=((ta2-ta1)/(Va2-Va1))*(V2-Va2) \quad (1)$$

where (ta2−ta1)/(Va2−Va1) is the inverse of the voltage drop rate.

At the step 100, the predetermined time to required to prepare for power shutdown, which corresponds to the time difference between generating the PFW signal and power shutoff, is subtracted from the time difference between the second voltage threshold value Va2 and the shutoff voltage threshold value V2 calculated in the step 90. The result of the calculation at the step 100 provides the amount of time for the bus voltage to drop from the second voltage threshold value Va2 to a minimum voltage where there remains time to issue a PFW signal, based on a voltage drop rate for current load conditions. The time difference t1−ta2 is calculated by:

$$t1-ta2=(t2-ta2)-tA \quad (2)$$

At the step 110, the time difference calculated at the step 100 is placed in a countdown timer. When the countdown timer reaches zero, a PFW signal is generated.

The steps 80, 90, and 100 are performed within a few processing cycles of the time ta2 when the timer value is read at the step 70. As such, placing the calculated time difference from the step 100 into a countdown timer at the step 110 substantially corresponds to time ta2. As such, the countdown timer reaches zero at substantially time t1, and the PFW signal is appropriately generated, thereby leaving time tA before the power supply unit is shutoff.

It is understood that the calculated voltage drop rate can be alternatively used to appropriately generate the PFW signal. For example, the bus voltage drop rate can be used along with the known shutoff voltage threshold value V2 and the known time tA required to prepare for power shutdown to calculate the PFW voltage threshold value. Once the bus voltage decreases to the calculated PFW voltage threshold value, the PFW signal is generated.

In an alternative embodiment, the load condition is determined, such as by the secondary side DSC/MCU or some external controller coupled to the power supply unit, and the determined load condition is communicated to the primary side DSC. In an exemplary embodiment, the load condition is determined by measuring an amount of current drawn by the load from the power supply unit. The primary side DSC uses the received load condition to set a corresponding PFW voltage threshold value, such as by using a look-up table.

The present application has been described in terms of specific embodiments incorporating details to facilitate the understanding of the principles of construction and operation of the method. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A method of generating a power failure warning signal, the method comprises: a. monitoring a bus voltage of a power supply unit; b. adjusting a power failure warning voltage threshold value according to a varying load condition of a load coupled to an output of the power supply unit, wherein adjusting the power failure warning threshold value comprises determining a bus voltage drop rate and setting the power failure warning voltage threshold value according to the bus voltage drop rate to allow a minimum time period between generating the power failure warning signal and powering off the power supply unit to prepare for power shutoff; and c. generating the power failure warning signal when the bus voltage drops to the power failure warning voltage threshold value.

2. A method of generating a power failure warning signal, the method comprises: a. setting a power shutoff voltage threshold value; b. setting a minimum time period to prepare for power shutoff; c. measuring a bus voltage within a power supply unit; d. determining a bus voltage drop rate; e. determining when a power failure warning signal is to be generated according to the power shutoff voltage threshold value, the minimum time period to prepare for power shutoff and the bus voltage drop rate; and f. generating the power failure warning signal.

3. The method of claim 2 further comprising adjusting when the power failure warning signal is to be generated according to a load condition of a load coupled to an output of the power supply unit.

4. The method of claim 2 wherein the bus voltage drop rate is greater for heavy load conditions than for light load conditions.

5. The method of claim 2 wherein determining when the power failure warning signal is to be generated comprises setting a power failure warning voltage threshold value by calculating a voltage equal to the bus voltage drop rate multiplied by the minimum time period to prepare for power shutoff and adding the calculated voltage to the power shutoff voltage threshold value, and comparing bus voltage to the set power failure warning voltage value.

6. The method of claim 5 wherein the power failure warning signal is generated when the bus voltage drops to the set power failure warning voltage value.

7. The method of claim 2 wherein determining the bus voltage drop rate comprises: a. setting a first voltage threshold value and a second voltage threshold value, wherein the first voltage threshold value is greater than the second voltage threshold value and the second voltage threshold value is greater than the power shutoff voltage threshold value; b. comparing the bus voltage to the first voltage threshold value and the second voltage threshold value; c. counting a time for the bus voltage to drop from the first voltage threshold value to the second voltage threshold value; and d. calculating the bus voltage drop rate by dividing a voltage difference between the first voltage threshold value and the second voltage threshold value by the counted time.

8. The method of claim 7 wherein determining when the power failure warning signal is to be generated and generating the power failure warning signal comprises: a. calculating a first time period for the bus voltage to drop from the second voltage threshold value to the power shutoff voltage threshold value according to the calculated bus voltage drop rate; b. subtracting the minimum time period to prepare for power shutoff from the first time period to equal a second time period; c. setting a timer to count the second time period; and d. generating the power failure warning signal when the second time period is counted.

9. The method of claim 2 wherein the bus voltage drop rate varies with varying load conditions of a load coupled to an output of the power supply unit.

10. A method of generating a power failure warning signal, the method comprises: a. setting a power shutoff voltage threshold value; b. setting a minimum time period to prepare for power shutoff; c. receiving a load condition corresponding to a load coupled to an output of a power supply unit; d. using a look-up table to determine a power failure warning voltage threshold value according to the power shutoff voltage threshold value, the minimum time period to prepare for power shutoff and the received load condition; and f. generating a power failure warning signal upon a bus voltage dropping to the power failure warning voltage threshold value.

11. The method of claim 10 further comprising adjusting when the power failure warning signal is to be generated according to a varying load condition.

12. A processing device for generating a power failure warning signal, the device comprises: a. means for setting a power shutoff voltage threshold value; b. means for setting a minimum time period to prepare for power shutoff; c. means for measuring a bus voltage within a power supply unit; d. means for determining a bus voltage drop rate; e. means for determining when a power failure warning signal is to be generated according to the power shutoff voltage threshold value, the minimum time period to prepare for power shutoff and the bus voltage drop rate; and f. means for generating the power failure warning signal.

13. The processing device of claim 12 wherein the means for determining when the power failure warning signal is to be generated comprises means for setting a power failure warning voltage threshold value by calculating a voltage equal to the bus voltage drop rate multiplied by the minimum time period to prepare for power shutoff and adding the calculated voltage to the power shutoff voltage threshold value, and means for comparing bus voltage to the set power failure warning voltage value.

14. The processing device of claim 12 wherein the means for determining the bus voltage drop rate comprises: a. means for setting a first voltage threshold value and a second voltage threshold value, wherein the first voltage threshold value is greater than the second voltage threshold value and the second voltage threshold value is greater than the power shutoff voltage threshold value; b. means for comparing the bus voltage to the first voltage threshold value and the second voltage threshold value; c. means for counting a time for the bus voltage to drop from the first voltage threshold value to the second voltage threshold value; and d. means for calculating the bus voltage drop rate by dividing a voltage difference between the first voltage threshold value and the second voltage threshold value by the counted time.

* * * * *